US008405189B1

(12) United States Patent
Ward et al.

(10) Patent No.: US 8,405,189 B1
(45) Date of Patent: Mar. 26, 2013

(54) CARBON NANOTUBE (CNT) CAPACITORS AND DEVICES INTEGRATED WITH CNT CAPACITORS

(75) Inventors: Jonathan W. Ward, Fairfax, VA (US); Quoc X. Ngo, Sterling, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 152 days.

(21) Appl. No.: 12/946,834

(22) Filed: Nov. 15, 2010

Related U.S. Application Data

(60) Provisional application No. 61/302,252, filed on Feb. 8, 2010.

(51) Int. Cl.
*H01L 21/02* (2006.01)

(52) U.S. Cl. ... 257/532; 257/534; 257/535; 257/E51.04; 257/E21.158; 438/675; 438/20; 438/381; 977/742; 977/752; 977/932; 977/948

(58) Field of Classification Search .......... 257/532, 257/534–535, E51.04, E21.158; 438/675, 438/20, 381; 977/742–752, 932, 948
See application file for complete search history.

(56) References Cited

U.S. PATENT DOCUMENTS

| 6,057,637 | A * | 5/2000 | Zettl et al. ............. 313/310 |
| 6,440,763 | B1 * | 8/2002 | Hsu .................. 438/20 |
| 6,574,130 | B2 | 6/2003 | Segal et al. |
| 6,643,165 | B2 | 11/2003 | Segal et al. |
| 6,706,402 | B2 | 3/2004 | Rueckes et al. |
| 6,784,028 | B2 | 8/2004 | Rueckes et al. |
| 6,835,591 | B2 | 12/2004 | Rueckes et al. |
| 6,911,682 | B2 | 6/2005 | Rueckes et al. |
| 6,919,592 | B2 | 7/2005 | Segal et al. |
| 6,924,538 | B2 | 8/2005 | Jaiprakash et al. |
| 6,930,343 | B2 * | 8/2005 | Choi et al. ............ 257/296 |
| 6,990,009 | B2 | 1/2006 | Bertin et al. |
| 7,115,901 | B2 | 10/2006 | Bertin et al. |
| 7,115,960 | B2 | 10/2006 | Bertin et al. |
| 7,211,844 | B2 * | 5/2007 | Furukawa et al. ......... 257/213 |
| 7,259,410 | B2 | 8/2007 | Jaiprakash et al. |
| 7,335,395 | B2 | 2/2008 | Ward et al. |
| 7,365,632 | B2 | 4/2008 | Bertin et al. |
| 7,402,770 | B2 * | 7/2008 | Sun et al. ............ 200/238 |

(Continued)

FOREIGN PATENT DOCUMENTS

WO  WO2009108175  * 9/2009

OTHER PUBLICATIONS

G. Zhang et al., "Hydrogenation and Hydrocarbonation and Etching of Single-Walled Carbon Nanotubes," J. Am. Chem. Soc, 2006, pp. 6026-6027 and S1-S3, vol. 128, No. 18, American Chemical Society.

(Continued)

*Primary Examiner* — N Drew Richards
*Assistant Examiner* — Ankush Singal
(74) *Attorney, Agent, or Firm* — McDermott Will & Emery LLP

(57) ABSTRACT

An example of a carbon nanotube capacitor may include (i) a carbon nanotube film having carbon nanotubes and voids with dielectric material, (ii) conductive contacts and (iii) a dielectric layer. The carbon nanotube film may switch from a conductive state to a non-conductive state when a voltage is applied by creating an electrical break within the carbon nanotube film and providing a first conductive region and a second conductive region within the carbon nanotube film. The electrical break may separate the first conductive region from the second conductive region. The first and second conductive regions may store charge. An integrated device may include one or more transistors and one or more carbon nanotube capacitors. A method of making a carbon nanotube capacitor is also disclosed.

22 Claims, 12 Drawing Sheets

U.S. PATENT DOCUMENTS

| | | | |
|---|---|---|---|
| 7,479,654 | B2 | 1/2009 | Bertin et al. |
| 7,560,136 | B2 | 7/2009 | Ward et al. |
| 7,564,269 | B2 | 7/2009 | Bertin |
| 7,566,478 | B2 | 7/2009 | Ward et al. |
| 7,598,127 | B2 * | 10/2009 | Whitefield et al. ............ 438/132 |
| 7,623,340 | B1 * | 11/2009 | Song et al. .................... 361/502 |
| 7,667,999 | B2 | 2/2010 | Herner et al. |
| 7,709,880 | B2 * | 5/2010 | Bertin et al. .................. 257/314 |
| 7,820,502 | B2 * | 10/2010 | Furukawa et al. ............ 438/199 |
| 7,852,612 | B2 * | 12/2010 | Zhao .............................. 361/502 |
| 7,898,045 | B2 * | 3/2011 | Furukawa et al. ............ 257/415 |
| 7,943,418 | B2 * | 5/2011 | Tombler, Jr. .................... 438/99 |
| 7,985,906 | B2 * | 7/2011 | Bertin et al. .................. 326/104 |
| 2003/0211724 | A1 * | 11/2003 | Haase ........................... 438/629 |
| 2005/0056877 | A1 * | 3/2005 | Rueckes et al. ............... 257/300 |
| 2005/0145838 | A1 * | 7/2005 | Furukawa et al. .............. 257/20 |
| 2005/0196950 | A1 * | 9/2005 | Steinhogl et al. ............ 438/622 |
| 2006/0214262 | A1 * | 9/2006 | Mosley et al. ................ 257/532 |
| 2006/0276056 | A1 | 12/2006 | Ward et al. |
| 2006/0292861 | A1 * | 12/2006 | Furukawa et al. ............ 438/627 |
| 2007/0001220 | A1 * | 1/2007 | Tombler et al. ............... 257/330 |
| 2007/0040488 | A1 * | 2/2007 | Watanabe et al. ............ 313/309 |
| 2007/0111460 | A1 * | 5/2007 | Mosley et al. ................ 438/381 |
| 2007/0258192 | A1 * | 11/2007 | Schindall et al. ............. 361/503 |
| 2008/0030352 | A1 * | 2/2008 | Shaw ............................ 340/579 |
| 2008/0044954 | A1 * | 2/2008 | Furukawa et al. ............ 438/129 |
| 2008/0142866 | A1 * | 6/2008 | Choi et al. .................... 257/309 |
| 2008/0157127 | A1 | 7/2008 | Bertin et al. |
| 2008/0212361 | A1 | 9/2008 | Bertin et al. |
| 2008/0231413 | A1 | 9/2008 | Bertin et al. |
| 2008/0237858 | A1 * | 10/2008 | Nihei ............................. 257/746 |
| 2008/0277646 | A1 * | 11/2008 | Kim et al. ....................... 257/14 |
| 2009/0068830 | A1 * | 3/2009 | Suh et al. ...................... 438/607 |
| 2009/0154218 | A1 | 6/2009 | Bertin et al. |
| 2009/0184389 | A1 * | 7/2009 | Bertin et al. .................. 257/476 |
| 2009/0194839 | A1 | 8/2009 | Bertin et al. |
| 2009/0239439 | A1 * | 9/2009 | Wei et al. ........................ 445/46 |
| 2009/0303801 | A1 * | 12/2009 | Kim ......................... 365/189.05 |
| 2009/0309456 | A1 * | 12/2009 | Stollberg ....................... 310/319 |
| 2010/0001267 | A1 | 1/2010 | Manning et al. |
| 2010/0005645 | A1 * | 1/2010 | Bertin et al. .................. 29/592.1 |
| 2010/0072459 | A1 | 3/2010 | Bertin et al. |
| 2010/0149895 | A1 * | 6/2010 | Kim ............................... 365/207 |
| 2010/0195261 | A1 * | 8/2010 | Sweeney et al. .............. 361/313 |
| 2010/0224998 | A1 * | 9/2010 | Duvall et al. .................. 257/767 |
| 2010/0259867 | A1 * | 10/2010 | Machida et al. .............. 361/502 |
| 2011/0073827 | A1 * | 3/2011 | Rubloff et al. ..................... 257/3 |
| 2011/0081770 | A1 * | 4/2011 | Tombler, Jr. .................. 438/466 |
| 2011/0083319 | A1 * | 4/2011 | Bertin et al. ..................... 29/622 |
| 2011/0149372 | A1 * | 6/2011 | Liu et al. ....................... 359/288 |
| 2011/0158894 | A1 * | 6/2011 | Lee ............................. 423/447.1 |
| 2011/0187240 | A1 * | 8/2011 | Hsu et al. ...................... 310/367 |
| 2011/0214264 | A1 * | 9/2011 | Hsu et al. ..................... 29/25.35 |

OTHER PUBLICATIONS

X. Ho et al., "Scaling Properties in Transistors That Use Aligned Arrays of Singe-Walled Carbon Nanotubes," Nano Letters, 2010, pp. 499-503, 10, American Chemical Society.

A. Hassanien et al., "Selective Etching of Metallic Single-Wall Carbon Nanotubes With Hydrogen Plasma," Nanotechnology, 2005, pp. 278-281, 16 Institute of Physics Publishing Ltd.

K. Ahmad et al., "Electrical Conductivity and Dielectric Properties of Multiwalled Carbon Nanotube and Alumina Composites," Applied Physics Letters, 2006, pp. 133122-1 through 133122-3, vol. 89, American Institute of Physics.

Rainer Waser, "Nanoelectronics and Information Technology: Advanced Electronic Materials and Novel Devices," 2005, p. 543, Wiley-VCH.

\* cited by examiner (along B-B')

(along C-C')

CARBON NANOTUBE (CNT) CAPACITORS AND DEVICES INTEGRATED WITH CNT CAPACITORS

CROSS-REFERENCES TO RELATED APPLICATIONS

The present application claims the benefit of priority under 35 U.S.C. §119 from U.S. Provisional Patent Application Ser. No. 61/302,252, entitled "CARBON NANOTUBE ON-CHIP CAPACITORS AND ULTRA-CAPACITORS," filed on Feb. 8, 2010, which is hereby incorporated by reference in its entirety for all purposes.

STATEMENT REGARDING FEDERALLY SPONSORED RESEARCH OR DEVELOPMENT

None.

FIELD

The subject technology relates in general to capacitors, and more particularly to, carbon nanotube (CNT) capacitors and devices integrated with CNT capacitors.

BACKGROUND

As semiconductor technology continues to scale, creating capacitors with acceptable capacitance values (e.g., >20 fF for dynamic random access memories (DRAMs)) becomes harder. Currently, the path for creating high capacitance structures on-chip is by employing deep trench structures or 3-D stacked structures to increase surface area, as shown in FIGS. 1A and 1B, respectively, with high dielectric constant material. Additionally, complex process integration is required to increase the surface area of the conducting plates as much as possible to increase the capacitance. Even with the complex designs and difficult process integration, for future scaling of DRAM devices (or other on-chip capacitor devices such as application-specific integrated circuits (ASICs)), high dielectric constant materials are required, and most DRAM foundries have begun implementing relatively high dielectric constant materials into their integration. However, such efforts are still not sufficient for continued scaling of DRAM capacitors and are not compatible with current semiconductor processing.

Therefore, there is a need for scalable capacitors that can be used in a variety of capacitance requirements, and particularly on-chip capacitance requirements, that would be useful for a wide range of electronics applications such as, but not limited to, ASICs, DRAM, and sensors.

SUMMARY

In one aspect of the disclosure, a carbon nanotube capacitor may comprise a carbon nanotube film comprising carbon nanotubes and voids having dielectric material, a first conductive contact disposed on the carbon nanotube film, and a second conductive contact disposed on the carbon nanotube film. A dielectric material may be disposed on the carbon nanotube film. The carbon nanotube film may switch from a conductive state to a non-conductive state when a voltage is applied by creating an electrical break within the carbon nanotube film and providing a first conductive region and a second conductive region within the carbon nanotube film. The electrical break may separate the first conductive region from the second conductive region within the carbon nanotube film. The first conductive region within the carbon nanotube film may store charge, and the second conductive region within the carbon nanotube film may store charge.

In one aspect of the disclosure, an integrated device may comprise a substrate, a transistor on the substrate, and a carbon nanotube capacitor on the substrate. The transistor may comprise multiple terminals (e.g., a source, a drain and a gate). The carbon nanotube capacitor may comprise a carbon nanotube film comprising carbon nanotubes and voids having dielectric material, a first conductive contact disposed on the carbon nanotube film, a second conductive contact disposed on the carbon nanotube film, and a dielectric layer disposed on the carbon nanotube film. The first conductive contact may be connected to one of the multiple terminals. The carbon nanotube capacitor may be either a horizontal carbon nanotube capacitor or a vertical carbon nanotube capacitor.

In one aspect of the disclosure, a method of manufacturing a carbon nanotube device may comprise: providing a carbon nanotube film comprising carbon nanotubes and voids; forming a first conductive contact on the carbon nanotube film; forming a second conductive contact on the carbon nanotube film; and forming a dielectric layer on the carbon nanotube film, which may provide dielectric material from the dielectric layer into voids in the carbon nanotube film. The method may also apply a voltage across the first conductive contact and the second conductive contact sufficient to switch the carbon nanotube film from a conductive state to a non-conductive state.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology.

DETAILED DESCRIPTION

Figure 1A:
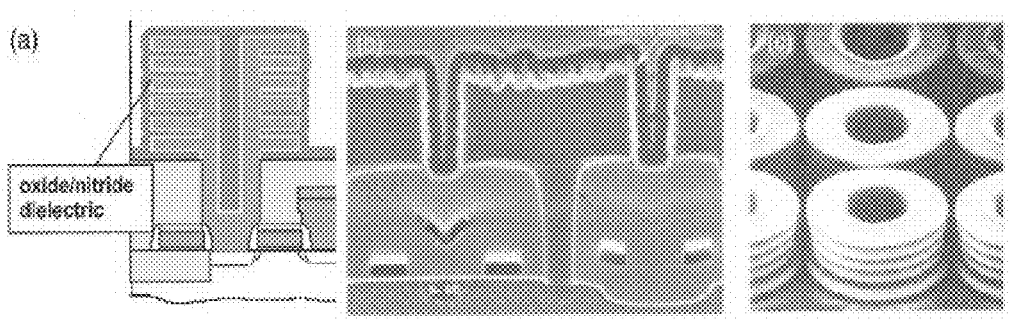
FIGS. 1A and 1B illustrate prior art capacitor structures.
Figure 1B:
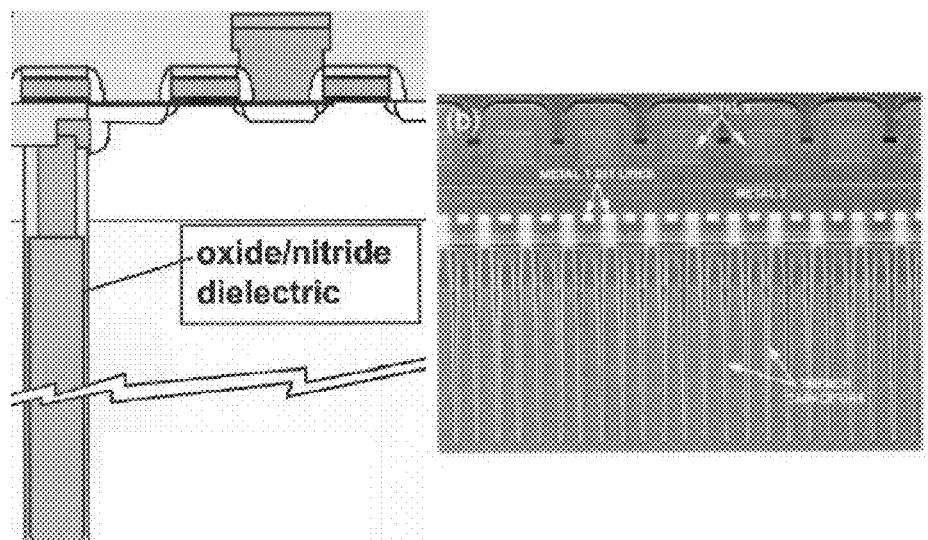

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In one aspect of the disclosure, the subject technology relates to a carbon nanotube (CNT) capacitor and/or ultra-capacitors and the method that may be used to create the CNT capacitor that can be integrated with semiconductor processes for a variety of on-chip capacitance requirements that would be useful for a wide range of electronics applications.

In one aspect of the disclosure, the subject CNT capacitor technology and the enabling methodology for creating the CNT capacitors have many advantages compared to the current on-chip capacitor technology, including, without limitation: (a) much higher surface area compared to similarly dimensioned metal plate capacitors; (b) ability to employ lower dielectric constant insulators with similar or higher capacitance compared to high dielectric constant material; (c) compatible with current semiconductor processing technology; (d) no requirement for complex designs such as deep trenches of 3-D structures; (e) no complex process integration to create high surface area capacitors; (f) tailorable capacitance through addition of other charge carriers—i.e., through functionalization; and/or (g) reduction in power and higher density devices (smaller structures for similar or higher capacitance).

In one aspect of the disclosure, one of the enabling processes for making CNT capacitors is the ability to switch a multilayered CNT fabric from a conducting state to a non-conducting state (e.g., by switching a CNT device from an on state to an off state). This switching can be accomplished with a high voltage pulse, electrically breaking the conduction path between CNTs. The device can be turned back on (e.g., to an on state) with another voltage pulse, thereby capacitively coupling between the CNTs in the fabric and closing the conduction path in the device. The term "conducting state" may sometimes be referred to as a "conductive state," "on state," or "closed state" and vice versa. The term "non-conducting state" may sometimes be referred to as a "non-conductive state," "off state," or "open state" and vice versa. The term "CNT fabric" may sometimes be referred to as "CNT film" and vice versa.

Techniques for voltage pulse toggling of CNT-based devices between open and closed states are known in the art for nonvolatile nanotube switching devices. For standard monolayered nonvolatile nanotube switching devices, voltages of 6-10V are generally sufficient to toggle the device off and on. However, higher voltages are required to toggle multilayered fabrics. Depending on the thickness of the fabric, 12-20V may be required. According to an aspect of the subject technology, the use of such multilayered CNT fabrics in capacitors allows that, after toggling the multilayered fabric to an open state, the lower operating voltages of the attached transistors (generally less than 3.3 V, depending on technology node) would not cause unwanted toggling of the CNT capacitor.

Although the CNT fabric may be toggled on or off at any point in the manufacturing process of the subject technology, in one exemplary aspect, the subject technology provides the ability to initially turn the device off without damaging an attached transistor such as a complementary metal oxide semiconductor (CMOS) transistor. This can be accomplished by employing designs and techniques to convert the CNT fabric to an open state during fabrication such as through the use of single use bond pads or a transistor inline with a fuse for programming, etc. Although the multilayered CNT fabric in the open state no longer conducts between contact electrodes, the nanotubes within the fabric can store charge. For a mono-layered fabric, the charge within the fabric would cause the device to normally toggle on; however, a multilayered fabric would require voltages (>12 V) that are higher than the operating regime of the connected transistors. Therefore, once the device is in the off or open state, a dielectric material may be deposited within the open CNT fabric, thereby creating a capacitor structure with a high surface area. Although the dielectric material primarily supplies the interface for charge storage, and high voltages would be required to turn the CNT fabric to an on state (or a closed state), the dielectric material can also provide a physical barrier to switching the CNT fabric.

In one aspect, the subject technology provides ease of fabrication and the ability to obtain high capacitance values while limiting the need to further increase the dielectric constant of the insulating material (or even allowing for the use of lower dielectric constant materials), which is largely due to the high surface area associated with the multilayered CNT fabric. CNT capacitors prepared according to an aspect of the subject technology can utilize less power than conventional devices and/or can provide equivalent (or higher) capacitance with smaller size structures. Additionally, capacitance can be tailored through the use of various functionalizations, as described below. On-chip CNT capacitors prepared according to an aspect of the subject technology can also be considered ultra-capacitors, which may be useful for a range of application including, but not limited to, DRAM, ASICs, sensor systems, and charge pumps.

Figure 2A:
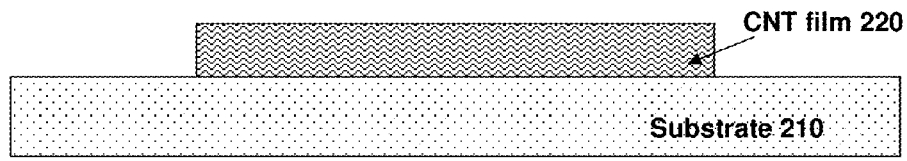
FIGS. 2A through 2G illustrate an example of the fabrication of a horizontal carbon nanotube (CNT) device structure.

In accordance with one aspect of the disclosure, FIGS. 2A through 2G show the fabrication of an exemplary discrete horizontally oriented CNT capacitor structure. FIG. 2A shows a CNT film 220 (e.g., a multilayered CNT fabric) deposited on a substrate 210. The terms CNT film and CNT fabric are sometimes used interchangeably. The CNT film 220 may comprise a plurality of CNTs and voids and/or pores. The substrate 210 may be insulating, semiconducting, or insulating with patterned metal contacts. The CNT film 220 may be patterned (e.g., using a photoresist and etching process as is known in the art) to match the configuration required by a desired chip design. The CNT film 220 shown in FIG. 2A may be in an on state (i.e., a conductive state) when it is deposited.

Figure 2B:
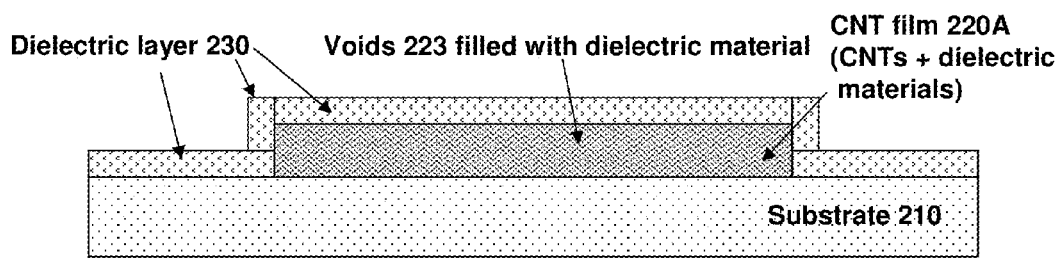

In FIG. 2B, a dielectric layer 230 may be conformably deposited within the patterned CNT film 220 to completely fill the voids and/or pores associated with the CNT film 220, and the same dielectric layer 230 may be deposited on the substrate 210. The dielectric layer 230 may be in direct contact with and completely surround the CNT film 220 (e.g., both the top and side surfaces of the CNT film 220). In addition, as stated above, some of the dielectric layer 230 may penetrate into the CNT film 220, and the CNT film 220 may thus become a CNT film 220A that includes CNTs and voids 223 filled with dielectric material. The dielectric layer 230 may be deposited by known techniques, such as atomic layer deposition (ALD) or chemical vapor deposition (CVD). ALD may offer certain advantages, such as highly conformal deposition and the ability to deposit a range of high dielectric constant material.

In one aspect, the voids in a CNT film may be filled while a dielectric layer is formed on the CNT film. In other words, while a dielectric layer is deposited, the voids may be filled simultaneously during the deposition. For example, the voids 223 in the CNT film 220 may be filled when approximately 150 Å of ALD alumina is deposited as a dielectric layer 230 on the CNT film 220 with greater than 120 pulses of tetramethyl aluminum (TMA) at a flow of 20 sccm and at a temperature greater than 150° C. This is one example, and the processing parameters and steps can be tailored for the desired thickness, film quality and film properties. It should be noted that voids may be filled using other methods, for example, utilizing the conformal nature of CVD and ALD deposition as known in the art.

Figure 2C:
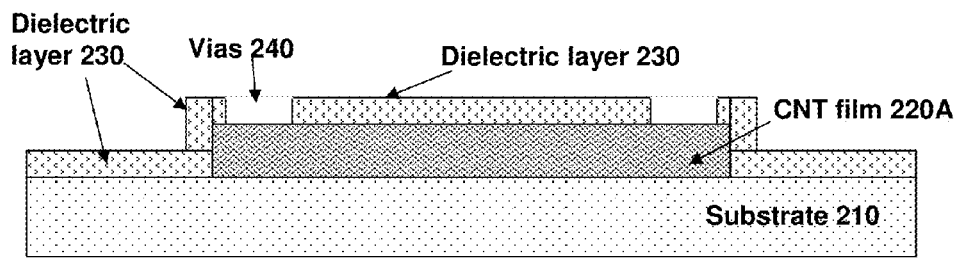

In FIG. 2C, vias 240 may then be etched into the dielectric layer 230 down to the CNT film 220A for contacting the CNT film 220A.

Figure 2D:
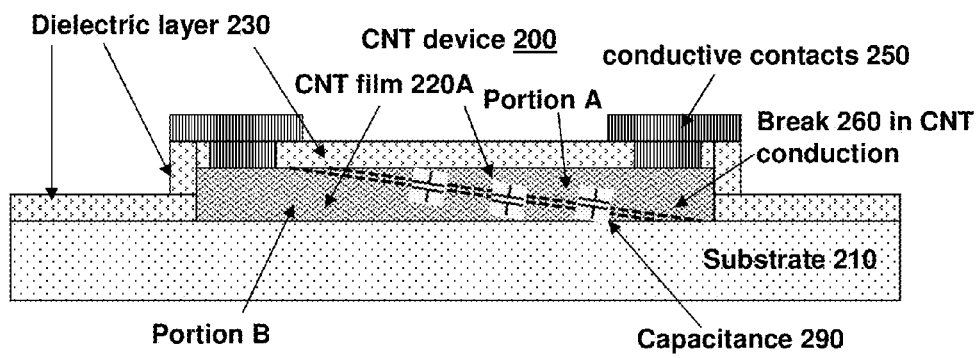

FIG. 2D shows the deposition and patterning of conductive contacts 250 (e.g., metal contacts). In one aspect, the term "a conductive contact" may refer to, be part of, or include, a conductive element, a conductive trace, an electrode, or a conductive layer.

The CNT film 220 in FIG. 2A and the CNT film 220A in FIGS. 2B-2D up to this point may be in a closed state (a conductive state). The conductive contacts 240 may then be used for toggling the CNT film 220A from a closed state (a conductive state) to an open state (a non-conductive state) and for electrically contacting the CNT capacitor structure. For example, when the CNT film 220A comprises a monolayer of CNTs (or a monolayered CNT fabric), a voltage pulse having an amplitude greater than 8V may be used to turn on or off the CNT film 220A. If the CNT film 220A comprises multiple layers of CNTs (or a multilayered CNT fabric), then a voltage pulse having a greater amplitude (e.g., greater than 12V such as 16-20V) may be required to turn on or off the CNT film 220A. During operation as a capacitor, the CNT device 200 utilizes operational voltages that are substantially lower than the turn-on/off voltages mentioned above (e.g., not greater than 3.3 V). Thus, the operational voltages would not toggle the CNT film 220A from an on state to an off state and vice versa.

In one example, the voltage used to toggle a CNT film from a conductive state to a non-conductive state and vice versa may be greater than twice the highest operating voltage of a CNT device operating as a capacitor. In another example, the toggle voltage may be greater than three times the highest operating voltage. In yet another example, the toggle voltage may be greater than X times the highest operating voltage, where X may be four times, five times, or six times.

Therefore, during a pre-operational or post-operational period (i.e., when the CNT device 200 does not operate as a capacitor), a high voltage pulse may be used to toggle the CNT film 220A from an on state to an off state and vice versa. During the normal operational period (i.e., when CNT device 200 operates as a capacitor), lower voltages may be utilized by the CNT device 200.

In one aspect, a multilayered CNT fabric is desired over a monolayered CNT fabric because it is less likely to cause unwanted toggling of the multilayered CNT fabric during normal operation because the difference between the turn-on/off voltage and the operating voltage is larger for the multilayered CNT fabric.

When the CNT film 220A is in an off state, there is an electrical break 260 in CNT conduction as shown in FIG. 2D. In this example, the CNT film 220A may be considered to be divided into three separate regions: (i) a region where the break 260 exists, (ii) a region labeled as portion A on one side of the break 260, and (iii) a region labeled as portion B on the other side of the break 260. During operation as a capacitor, the CNT film 220A is in the off state (i.e., a non-conducting state), and there is no electrical conduction across the break 260, but each of the portions A and B can store charge. As a result, conceptually, capacitance 290 can be seen across the break 260 as shown in FIG. 2D when the CNT device 200 operates as a capacitor.

In one aspect of the disclosure, a break (or an electrical break) shown in the figures is only an exemplary representation of a break, and other break orientations and/or representations are possible. Furthermore, in one aspect, a break is referred to as an electrical break since a break does not represent a structural break in the CNTs.

As shown in FIG. 2D, a CNT device 200 may comprise a CNT film 220A, conductive contacts 250 and a dielectric layer 230. In one aspect, the CNT film 220A may be disposed on the top surface of a substrate 210. The dielectric layer 230 may be disposed on the top surface of the substrate 210 and disposed on the top surface of the CNT film 220A. The dielectric layer 230 may be also disposed on the side surfaces of the CNT film 220A. The conductive contacts 250 may be disposed on the CNT film 220A through the vias 240 in the dielectric layer 230 and also disposed on the dielectric layer 230. In one aspect, the dielectric layer 230 may completely surround the CNT film 220A, except in the areas where the CNT film 220A is attached to the substrate 210 or where the CNT film 220A is connected to the conductive contacts 250. In one aspect, CNT film 220A may be planar and its length or width is greater than its thickness. In one aspect, the conductive contacts 250 are separated horizontally from each other by a fixed distance and aligned to each other vertically (i.e., same height and on the same level in the vertical direction). In one aspect, one of the conductive contacts 250 is disposed at one edge of the CNT film 220A, and another one of the conductive contacts 250 is disposed at another edge of the CNT film 220A. A portion of the dielectric layer 230 is disposed between the conductive contacts 250.

It should be noted that an element may be disposed on another element directly or indirectly by being attached directly or indirectly, or connected directly or indirectly, to the other element. In a preferred aspect, the conductive contacts 250 are disposed directly on the CNT film 220A or on portions of the top surface of the CNT film 220A so that a voltage can be applied to the CNT film 220A using the conductive contacts 250 as electrodes. In a preferred aspect, the dielectric layer 230 is directly disposed on the CNT film 220A or on portions of the top surface of the CNT film 220A so that some of the dielectric layer 230 may fill the voids in the CNT film 220A (or preferably, fill the voids throughout the entire thickness of the CNT film 220A).

Figure 2E:
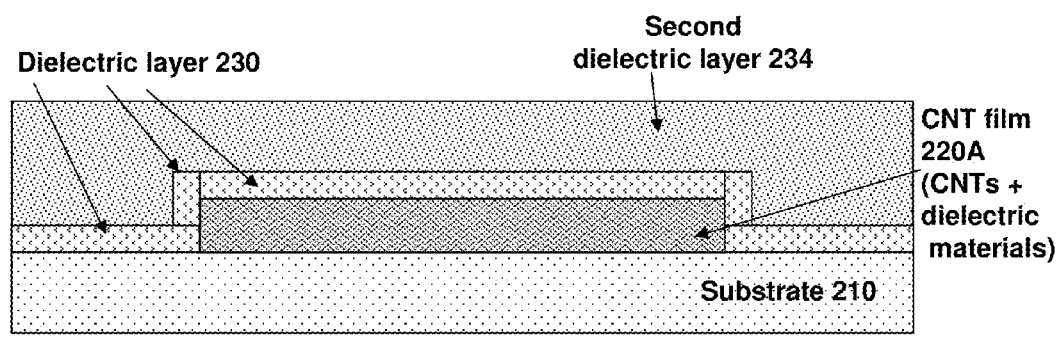
Figure 2F:
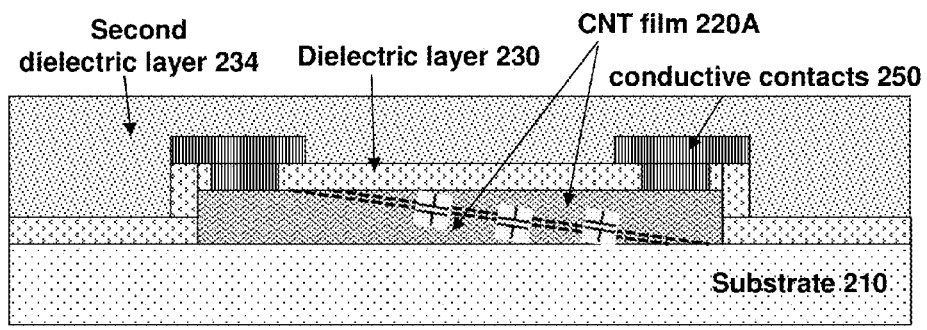

As illustrated in FIG. 2E, a second dielectric layer 234 may be optionally deposited without affecting the properties of the CNT film 220A after deposition of the dielectric layer 230. The second insulating material 234 may be used to protect the capacitor structure and/or to act as an etch hard mask or chemical mechanical planarization (CMP) stop. In another configuration, a second dielectric layer 234 may be optionally deposited without affecting the properties of the CNT film 220A after deposition and patterning of conductive contacts 250, as shown in FIG. 2F.

Figure 2G:
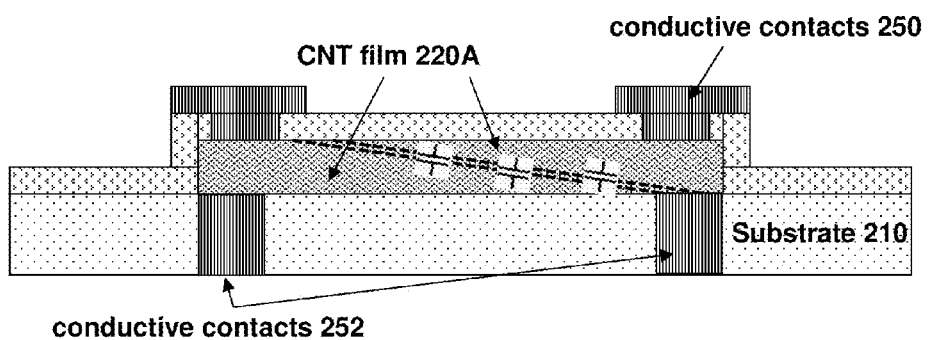

In yet another configuration, as shown in FIG. 2G, secondary conductive contacts 252 (e.g., metal contacts) may be optionally formed and connected to the CNT film 220A to separate the function of toggling of the CNT film from the function of utilization of the CNT device as a capacitor in that the two conductive contacts 250 may be used as electrodes to apply a voltage to turn on or off the CNT film 220A, and the two conductive contacts 252 may be used to apply a voltage to charge or discharge the CNT device. In yet another configuration, a combination of some or all of the configurations shown in FIGS. 2D-2F may be utilized.

A CNT film (e.g., 220 or 220A) may be, for example without limitation, 50-5000 nm in thickness, 200-10000 nm in width and 200-10000 nm in length. A dielectric layer (e.g., 230, 232, 234) may have a thickness similar to that of the CNT film 220 or 220A. In one aspect, the dielectric layer 232 or 234 may be of the same material as the dielectric layer 230. In another aspect, the dielectric layer 232 or 234 may be made of a different material than that of the dielectric layer 230.

Unless stated otherwise, the descriptions of the structures and dimensions provided with reference to FIGS. 2A-2G may apply to configurations described with reference to other figures.

Figure 3A:
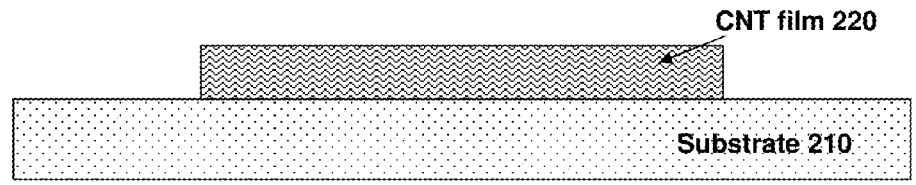
FIGS. 3A through 3D illustrate another example of the fabrication of a horizontal CNT device structure.
Figure 3B:
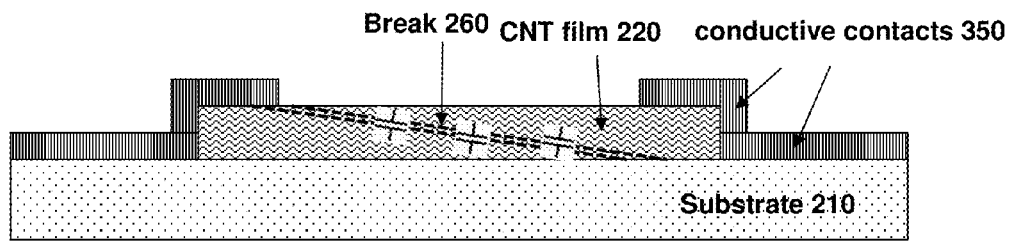

In accordance with one aspect of the disclosure, FIGS. 3A through 3D show another exemplary embodiment of a horizontal on-chip CNT capacitor structure. FIG. 3A is the same as FIG. 2A. In FIG. 3B, conductive contacts 350 may be deposited on the substrate 210 and patterned selective to the CNT film 220. Once the conductive contacts 350 are deposited, CNT film 220 may be switched from an on state (i.e., a conductive state) to an open state (i.e., a non-conductive state) by applying a voltage pulse between the conductive contacts 350. The voltage pulse may create an electrical break 260 and multiple conductive regions. The conductive regions may be separated from each other by the electrical break 260 and may store charge.

In another alternative embodiment, the voltage pulse may be applied after the dielectric layer 230 is deposited (see FIG. 3C) to switch the CNT film from an on state to an off state.

Figure 3C:
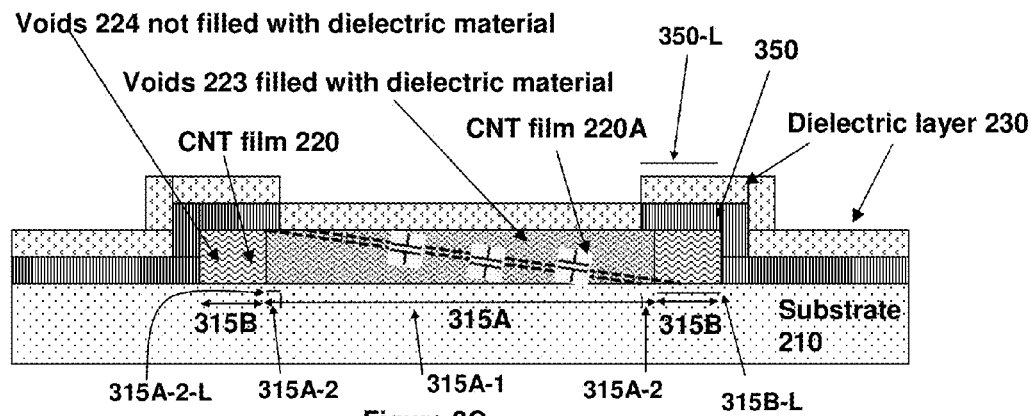

In FIG. 3C, a dielectric layer 230 having a high dielectric constant may be deposited on the CNT film and the conductive contacts 350. Some of the dielectric material from the dielectric layer 230 may penetrate into the CNT film 220 and fill the voids in the CNT film 220 in the region 315A, and as a result, the CNT film 220 becomes a CNT film 220A in the region 315A. The CNT film 220A comprises CNTs and voids 223 having dielectric material. In this example, the CNT film 220A includes the electrical break 260 and two separate conductive regions.

The CNT film 220 in the regions 315B is covered by the conductive contacts 350 (instead of the dielectric layer 230) and thus does not receive dielectric material, and remains as CNT film 220, which has CNTs and voids 224 not filled with dielectric material. The CNT film 220 in the regions 315B is conductive. In one aspect, the regions 315B (and the CNTs therein) are coupled/connected to the region 315A (and the CNTs therein), where the charge storage takes place. In another aspect, if all of the region 315A is insulating, then the charge storage may take place at the interface between the regions 315B and the region 315A.

The region 315A may include an area 315A-1 in the CNT film that is under the dielectric layer 230 (or that is in contact with the dielectric layer 230). The region 315A may further include areas 315A-2 in the CNT film that are directly adjacent to the area 315A-1 on both sides of the area 315A-1. The areas 315A-2 are not in contact with the dielectric layer 230 but rather covered by the conductive contacts 350. However, because the areas 315A-2 are directly adjacent to the area 315A-1, the dielectric material is deposited within the area 315A-1 as well as the areas 315A-2. In one example, the length 315A-2-L of each of the areas 315A-2 may be the same as the thickness of the CNT film 220 or 220A.

Each of the regions 315B under the conductive contacts 350 may have a length 315B-L that is the length (350-L) of a conductive contact 350 over the CNT film 220 minus the length 315-2-L.

Figure 3D:
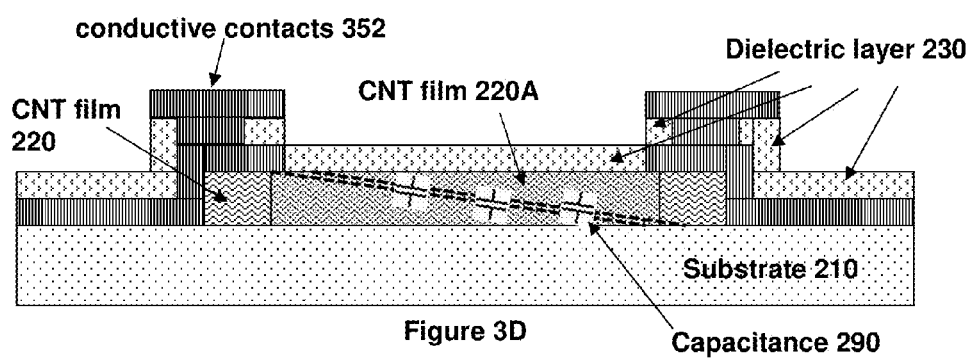

In FIG. 3D, secondary conductive contacts 352 may be optionally deposited and patterned to make contacts to the conductive contacts 350.

In one aspect, the process described with reference to FIGS. 3A-3D has the advantage that the switching of the CNT film can occur prior to the deposition of the dielectric layer 230, as shown in FIG. 3B (e.g., switching the CNT film 220 from a conductive state to a non-conductive state without the dielectric layer 230 on the CNT film 220), and the deposition of the dielectric layer 230 after switching can prevent any potential electro-mechanical movement of the CNT film during operation. In one aspect, this could potentially change the state of a device; however, this would still be unexpected because of the high switching voltages required.

Figure 4:
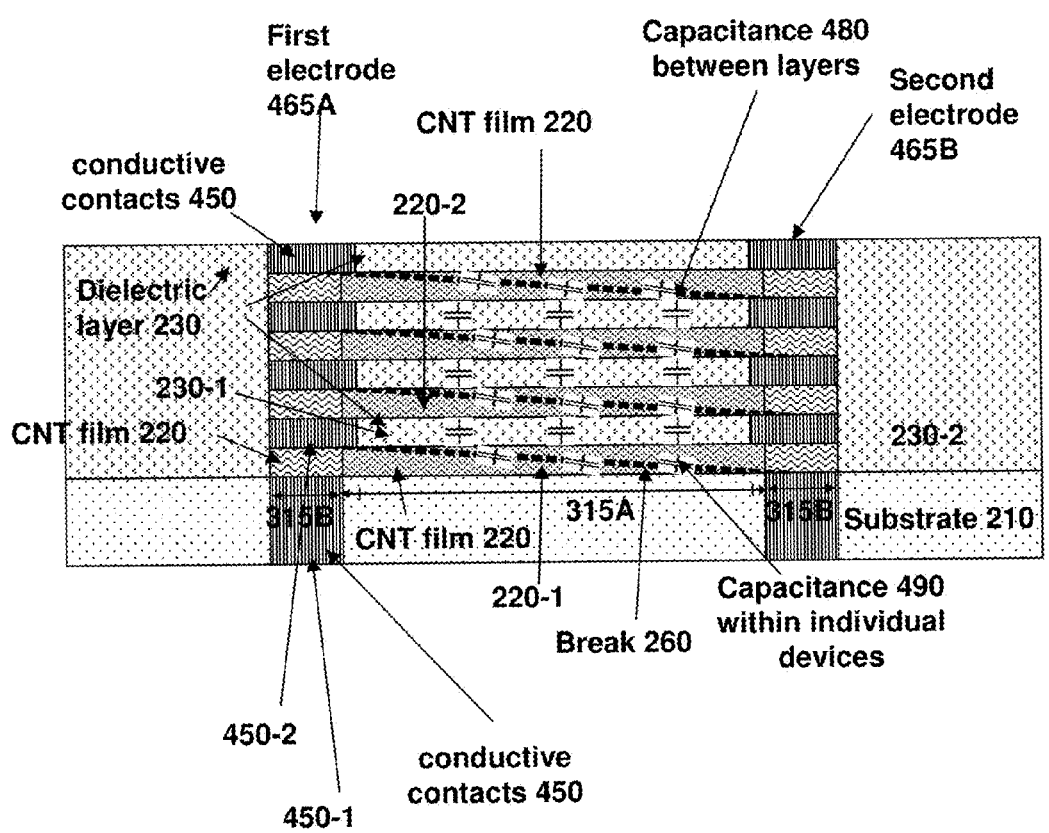
FIG. 4 illustrates an example of a stacked CNT device structure including horizontal CNT devices.

FIG. 4 shows a schematic of an exemplary stacked CNT capacitor structure. Fabrication of a stacked CNT device structure 400 may be similar to that shown in FIGS. 3A-3C, except that there are now multiple CNT devices stacked vertically.

In one aspect, a CNT film 220 is deposited and patterned, conductive contacts 450 (e.g., metal contacts) are deposited and patterned, the CNT film is turned off, the dielectric layer 230 having high dielectric constant is deposited, and then the process is repeated to form multiple layers of CNT devices that are connected as capacitors.

According to one exemplary process, conductive contacts 450 (e.g., the lowest conductive contacts 450-1 in the stack in this case) may be formed first in the substrate 210. The conductive contacts 450 in the substrate 210 may be connected to underlying transistors such as CMOS transistors (see, e.g., FIGS. 6A-6C for transistors). The conductive contacts 450 are separated horizontally from each other by a fixed distance and disposed vertically on the same level in the substrate 210.

A CNT film 220 (e.g., the lowest CNT film 220-1 in the stack) may then be deposited on the substrate 210 and deposited directly on the top surface of the conductive contacts 450 in the substrate 210. The CNT film 220 may be patterned so that a first edge of the CNT film 220 is in direct contact with a first one of the conductive contacts 450 in the substrate 210, and a second edge of the CNT film 220 is in direct contact with a second one of the conductive contacts 450 in the substrate 210.

In one aspect, each CNT film 220 may be made thinner than the CNT film shown in FIG. 2A-2G or 3A-3D. Each CNT film 220 may be, for example without limitation, 5-50 nm in thickness. This can allow more effective coating of CNTs during the deposition of dielectric layer 230 on the CNT film (e.g., more effective penetration of dielectric material into the voids of CNTs during the deposition of the dielectric material).

While the conductive contacts 450 are shown as lower contacts (i.e., the contacts are located below the respective CNT films), the conductive contacts 450 may be located on top or side(s) of the respective CNT films, or some combination of top, sides(e) and bottom of the respective CNT films.

A voltage pulse may be applied between the conductive contacts. This can create an electrical break 260 in the CNT film 220, and as a result, switch the CNT film 220 from a conductive state to a non-conductive state. As described above, the portion of the CNT film 220 on one side the break 260 and the portion of the CNT film 220 on the other side of the break 260 may store charge.

The switching operation described above may be performed after the deposition of the dielectric layer 230 (instead of performing it before the deposition of the dielectric layer). However, as discussed above, it is more advantageous to perform the switching operation prior to depositing the dielectric material on the CNT film.

Conductive contacts 450 (e.g., conductive contacts 450-2 on the next lowest level in the stack) may then be deposited and patterned on the CNT film 220 (e.g., the lowest CNT film 220-1 in the stack). A dielectric layer 230 (e.g., the lowest dielectric layer 230-1 in the stack) may then be deposited and patterned.

Each dielectric layer 230 in FIG. 4 may be thinner than the dielectric layer shown in FIG. 2A-2G or 3A-3D. Each dielectric layer 230 in FIG. 4 may be, for example without limitation, 5-50 nm in thickness. In one aspect, it is advantageous to have a thinner dielectric layer to increase capacitance. However, the thickness of the dielectric layer 230 is the same as the thickness of the conductive contacts 450 on the same level, and the conductive contacts 450 need to have sufficient thickness to apply voltages and conduct current. Hence, the advantage of having thin dielectric layer 230 needs to be balanced with the requirements of the conductive contacts 450.

Similar to the process described with respect FIGS. 3C and 3D, when the dielectric layer 230-1 is deposited after the conductive contacts 450-2 are formed, then a region 315A in the CNT film 220-1 comprises CNTs with voids filled with dielectric material from the dielectric layer 230-1. The regions 315B of the CNT film 220-1 comprise CNTs with voids, where the voids are not filled with dielectric material.

When the CNT films 220 are in an off state, each CNT film 220 within the region 315A includes (i) an electrical break 260 (where no conduction occurs) and (ii) multiple conductive regions (where conduction can occur and which can store charge) that are separated by the electrical break 260. Each CNT film 220 within the region 315B is conductive.

According to an alternative processing method, a dielectric layer 230 may be deposited and patterned before depositing and patterning conductive contacts 450 at any level above the substrate 210. For example, a dielectric layer 230-1 may be deposited and patterned before the conductive contacts 450-2. In that situation, the entire length of the CNT film 220 may be directly under the dielectric layer 230 after the deposition of the dielectric layer 230 but before the deposition of the conductive contacts (see, e.g., FIG. 2B), and the CNT film 220 (for the entire length) may include CNTs as well as dielectric material in its voids.

Additional CNT devices may be formed by repeating the steps of forming layers of CNT films 220, conductive contacts 450 and dielectric layer 230. The outer dielectric layer(s) 230-2 on the sides of the conductive contacts 450 and the CNT films 220 may be formed simultaneously with the inner dielectric layers within the stack (e.g., item 230-1 and the dielectric layers above the 230-1). Alternatively, the outer dielectric layer(s) 230-2 may be formed separately from the inner dielectric layers (e.g., form the outer dielectric layer(s) 230-2 after forming the stacked layers of CNT films 220, conductive contacts 450 and inner dielectric layers).

The stacked CNT device structure 400 may comprise multiple CNT devices stacked vertically. Each CNT device may comprise conductive contacts 450, a CNT film 220 and a dielectric layer 230. In this example, the conductive contacts 450 are disposed below the corresponding CNT film 220, separated horizontally from each other and connected to the CNT film 220 at two edges of the CNT film 220. The dielectric layer 230 is disposed directly on the CNT film 220 between the conductive contacts 450 of the next level CNT device. When a CNT film 220 is in a non-conductive state, the CNT film 220 includes an electrical break 260, and capacitance 490 can be seen in each individual CNT device. Capacitance 480 can also be seen between CNT devices (or between layers). This would further increase the capacitance of the device.

According to an alternative method, the CNT films 220 may be switched from a conductive state to a non-conductive state simultaneously at once after the stack has been built, rather than switching the individual CNT films one at a time during fabrication. For example, after forming the last CNT film 220 and the last conductive contacts 450 in the stack, a voltage pulse may be applied at once across the first electrode 465A (as a positive or negative electrode) and the second electrode 465B (as a negative or positive electrode) to switch all of the CNT films 220 in the stack from a conductive state to a non-conductive state simultaneously. The first electrode 465A may comprise the stack of the conductive elements 450 (e.g., five conductive elements in this example) on the left side of the stack and the stack of the CNT film 220 (e.g., the four CNT films sandwiched among the five conductive elements) within the region 315B on the left side of the stack. The second electrode 465B may comprise stack of the conductive contacts 450 on the right side of the stack and the stack of the CNT film 220 within the region 315B on the right side of the stack.

The voltage required to switch multiple CNT films at once may be higher than the voltage required to switch a single CNT film. For example without limitation, while a greater than 12V may be required to switch a single CNT film, greater than 48V may be required to switch four CNT films stacked together at once.

In one aspect, the dielectric layer 230 of one CNT device and the conductive contacts 450 of the next CNT device are co-planar throughout the stack. For example, the dielectric layer 230-1 for the CNT film 220-1 and the conductive contacts 450-2 for the next CNT film 220-2 are co-planar (e.g., the top surfaces of 230-1 and 450-2 are the same height; the bottom surfaces of 230-1 and 450-2 are at the same height; and the thickness of 230-1 and the thickness of 450-2 are the same).

In this example, each CNT film is associated with the conductive contacts 450 below the CNT film. For instance, a CNT film 220-1 is associated with the conductive contacts 450-1. In another example, each CNT film may be associated with the conductive contacts 450 above the CNT film. For instance, a CNT film 220-1 may be associated with the conductive contacts 450-2.

In one aspect, there are several advantages associated with the structure shown in FIG. 4, including but not limited to: (1) thinner CNT film (e.g., CNT fabrics) can be employed, thereby permitting lower voltages to toggle off during fabrication without compromising any voltages required during capacitor operation; (2) more reliable filling of pores within the CNT film; (3) higher surface area associated with the capacitor structure; (4) possibility of making the entire stack with chemical mechanical planarization (CMP) before etching the stack, which can save multiple photo-levels; and (5) additional advantage of capacitance between adjacent levels can significantly increase overall capacitance.

With respect to the aspect (4) outlined in the forgoing paragraph, CMP may be performed as the final processing step before etching the entire stack. For example, all of the required layers and the final insulating deposition (either high dielectric constant (k) or low dielectric constant (k) material) may be deposited and planarized before the CNT-low k stack is etched. One important advantage is that two or more CNT-low k levels can be deposited without having to etch level. Another advantage is that the structure would be selfaligned—i.e., there is no need to align the upper levels to the lower levels, which can create process and operational reliability issues.

Figure 5A:
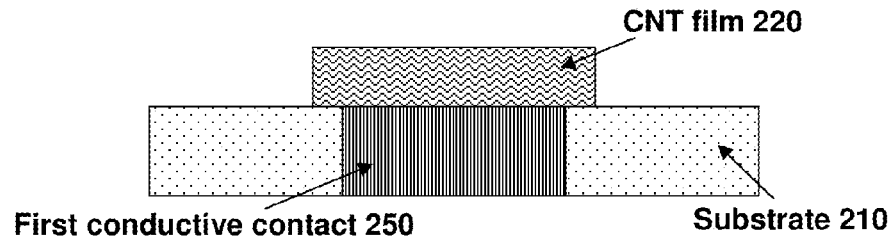
FIGS. 5A-5H illustrate an example of the fabrication of a vertical CNT device structure.
Figure 5B:
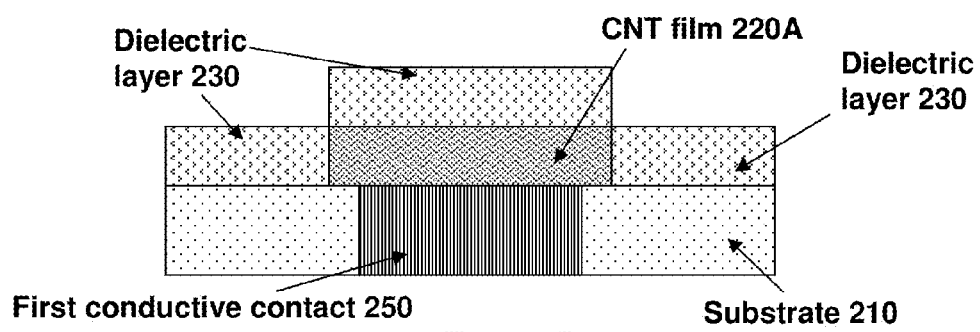

FIGS. 5A through 5H show an exemplary fabrication of a vertical CNT capacitor. In FIG. 5A, after forming a first conductive contact 250 (e.g., a lower metal contact) in a substrate 210 (e.g., an insulating substrate), a CNT film 220 (e.g., a multilayered CNT fabric) may be deposited on top of the substrate 210. After patterning the CNT film 220, a dielectric layer 230 (e.g., a high dielectric constant material such as an ALD material) may be deposited to conformably coat the CNT film as shown in FIG. 5B. As described above, some of the dielectric layer 230 may penetrate into the CNT film filling the voids in the CNT film 220. This CNT film is shown as CNT film 220A in FIG. 5B.

Figure 5C:
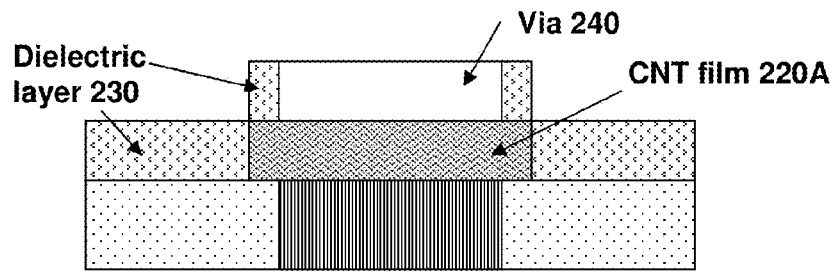

A via 240 may then be etched into the dielectric layer 230 down to the CNT film 220A to expose the top of the CNT film 220A, as shown in FIG. 5C. In an alternative method, the dielectric layer 230 may be chemical-mechanical polished, giving a planar surface without the need for a via etch.

Figure 5D:
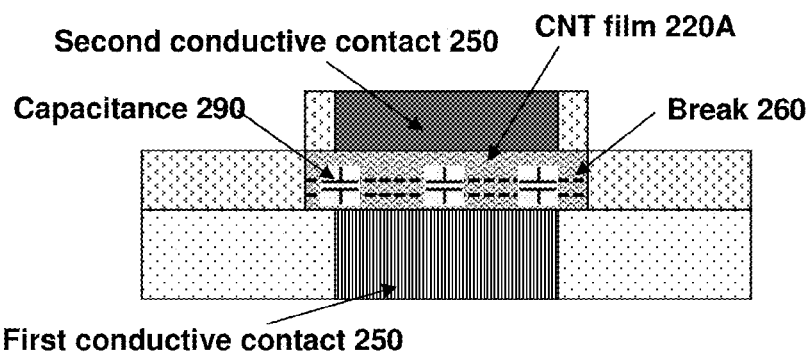

A second conductive contact 250 (e.g., an upper metal contact) may be deposited, patterned and connected to the top surface of the CNT film 220A, as shown in FIG. 5D. The CNT film 220A may then be toggled from a conductive state to a non-conductive state, by creating an electrical break 260, as described above. During operation as a capacitor, capacitance 290 can be seen in the CNT device. The first conductive contact 250 under the CNT film 220A may be used as a bottom metal contact connected to one or more other devices (e.g., transistors or diodes).

Figure 5E:
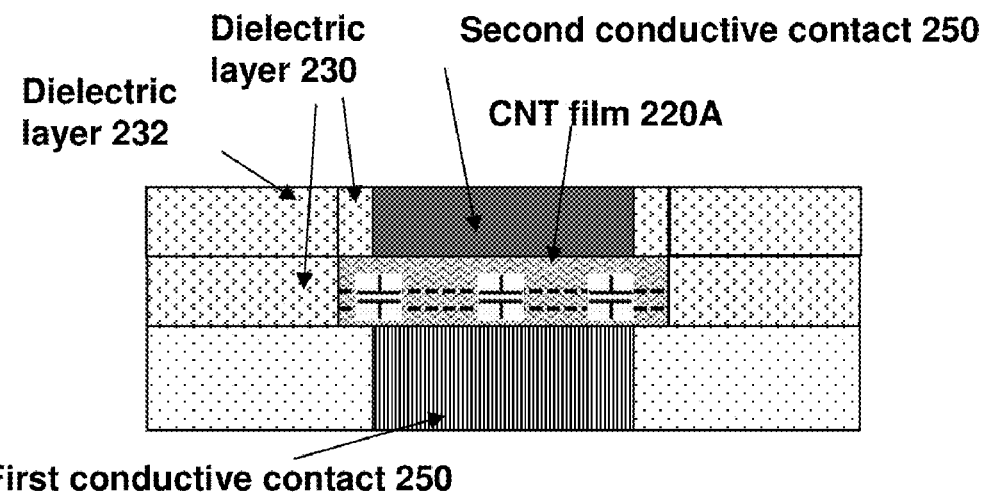

A second dielectric layer 232 can optionally be deposited, and the second dielectric layer 232 and the dielectric layer 230 can be planarized relative to the second conductive contact 250 (upper metal contact), as shown in FIG. 5E.

Figure 5F:
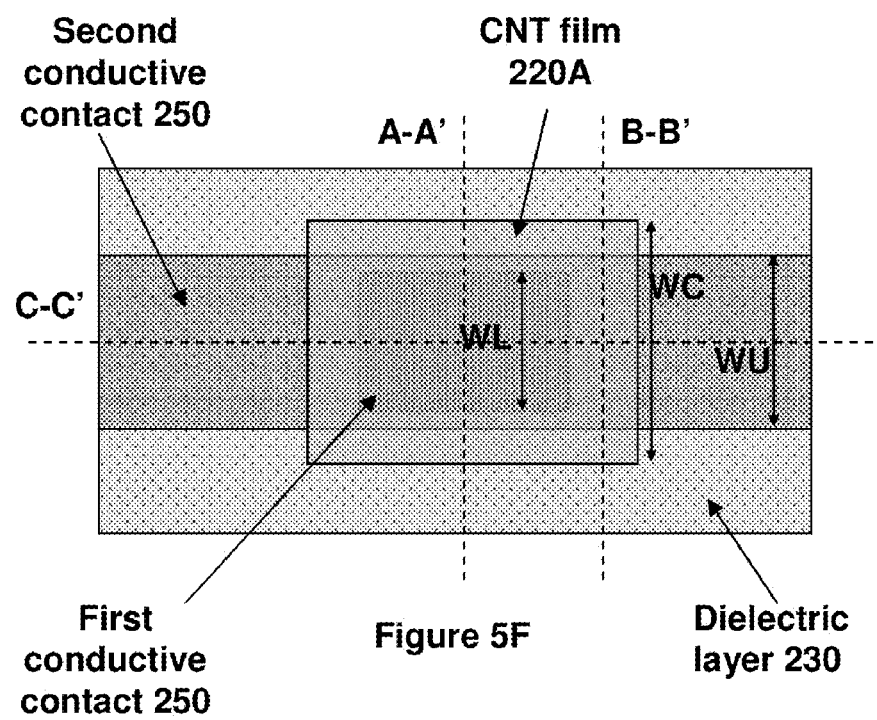
Figure 5G:
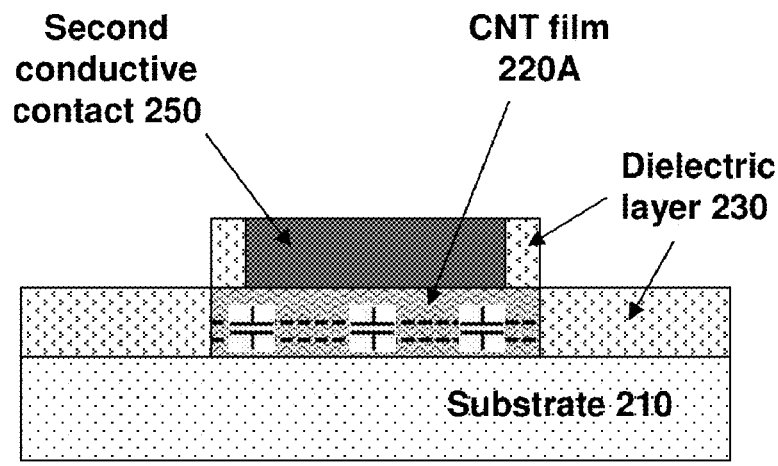
Figure 5H:
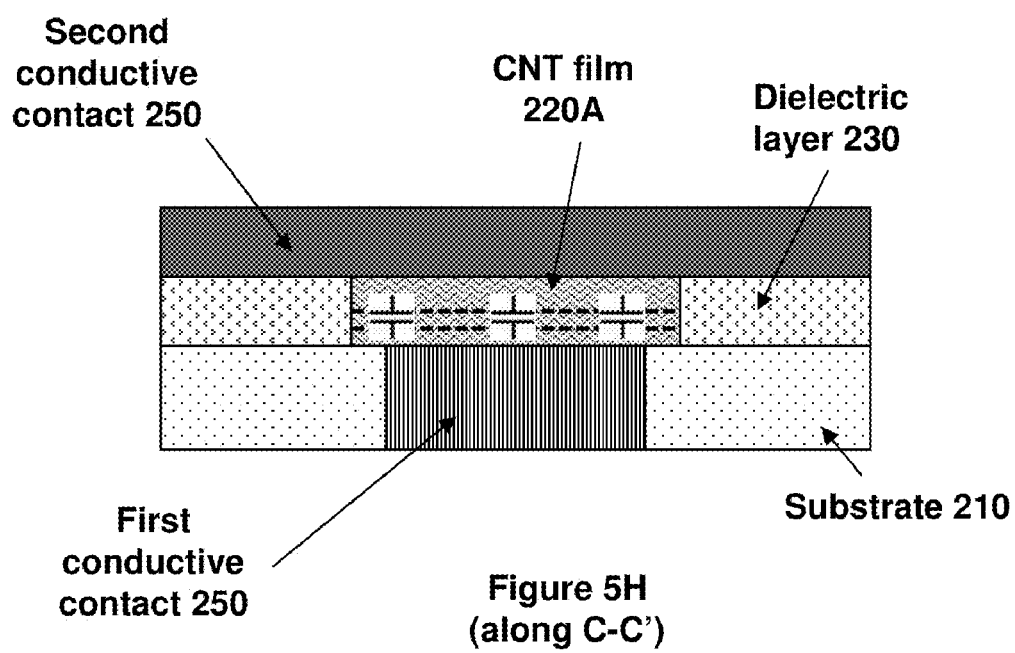

FIG. 5F is a plan view of the vertical CNT capacitor structure of FIG. 5D. A cross-sectional view of the vertical CNT capacitor structure along A-A' is shown in FIG. 5D. A cross-sectional view of the vertical CNT capacitor structure along B-B' is shown in FIG. 5G. A cross-sectional view of the vertical CNT capacitor structure along C-C' is shown in FIG. 5H.

One advantage of the vertical scheme shown in FIGS. 5A-5H is that a CNT capacitor can be the same width or smaller than the contact vias (e.g., first conductive contact 250) that contact underlying transistors. The structure shown in FIGS. 5D-5H can thus minimize the cell area.

The CNT film 220, 220A in FIGS. 5A-5H may have dimensions (e.g., thickness, length and width) similar to those of the CNT film 220 or 220A in FIGS. 2A-2D. The width (WL) of the first conductive contact 250 in FIG. 5F (lower metal contact) can scale with the width (WC) of the CNT film 220, 220A. The width (WU) of the second conductive contact 250 in FIG. 5F (upper metal contact) may also scale with the width of the CNT film 220, 220A. In one aspect, WL, WU and WC may be substantially the same (e.g., WL and WU may differ by 0-50%, and WC and WU may differ by 0-25%).

Figure 6A:
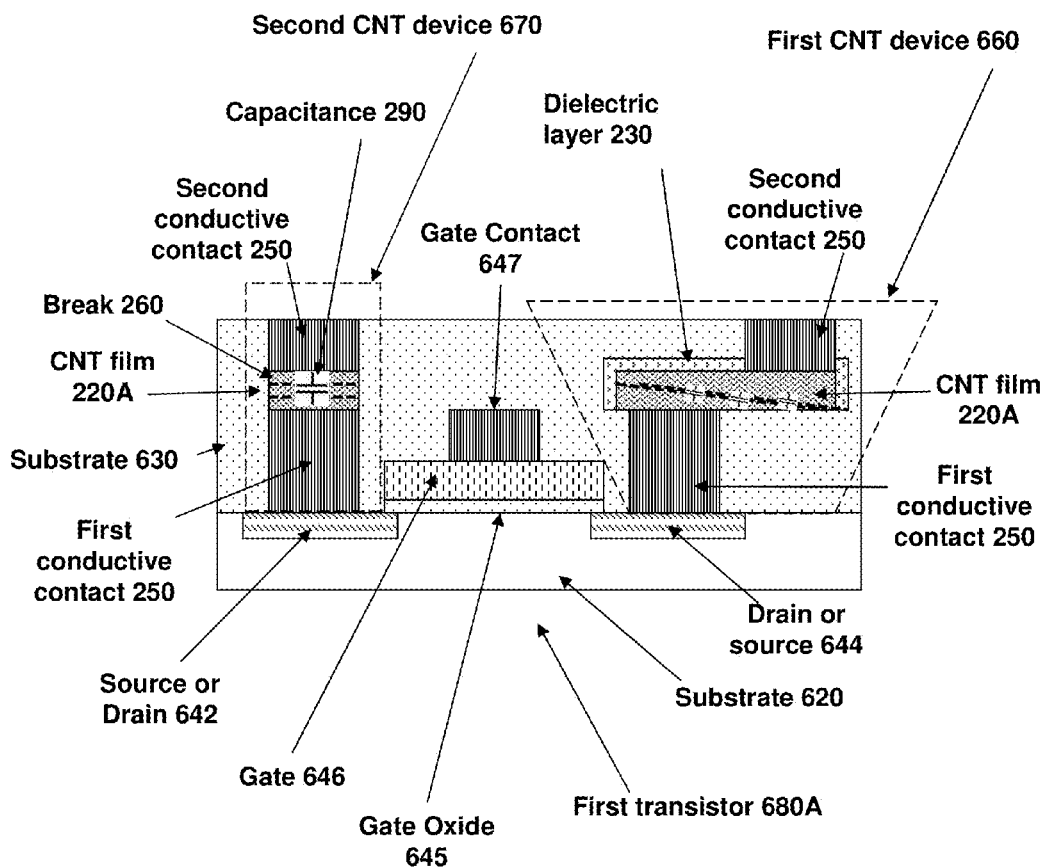
FIGS. 6A through 6C illustrate examples of integrated devices.

FIG. 6A shows an example of the integration of CNT capacitors for applications such as a DRAM. A DRAM may be a 1T1C device (1 transistor, 1 capacitor) that is the mainstay for current volatile memory. As DRAM continues to scale in the future, one of the biggest challenges is the fabrication of capacitors with a capacitance >20 fF. FIG. 6A shows an example of the integration of either a vertically oriented or horizontally oriented CNT capacitor in contact with the source/drain region of a transistor.

In FIG. 6A, a device 610A (e.g., DRAM) may comprise a transistor 680A and a capacitor. The transistor 680A may comprise multiple terminals (e.g., a source, a drain and a gate). The transistor 680A may comprise a first region 642, which may a source or a drain, and a second region 644, which may be a drain or a source, respectively. The transistor 680A may further comprise a gate oxide 645, a gate 646 (e.g., a polysilicon gate), and a gate contact 647. The transistor 680A is formed on a substrate 620 (e.g., silicon substrate). A capacitor for the transistor 680A may be the first CNT device 660, the second CNT device 670 or both. The first CNT device 660 and the second CNT device 670 are formed within an upper substrate 630. The substrate 630 may be, for example, an insulator made of dielectric material. The first CNT device 660 and the second CNT device 670 may be formed after the transistor 680A is formed. The first CNT device 660 and the second CNT device 670 may be formed simultaneously (e.g., using the same photomasks) or sequentially.

The first CNT device 660 may be a horizontal CNT capacitor. The first CNT device 660 may comprise a CNT film 220A, a first conductive contact 250, a second conductive contact 250, and a dielectric layer 230. In this example, the first conductive contact 250 is disposed below, at a first end of, and in contact with the CNT film 220A. The first conductive contact 250 may be in contact with a source or drain 644 of the transistor 680A. The second conductive contact 250 is disposed on, at a second end of, and in contact with the CNT film 220A. The first conductive contact 250 is separated horizontally from the second conductive contact 250. The dielectric layer 230 is disposed on top and sides of the CNT film 220A. The CNT film 220A may comprise CNTs and voids filled with dielectric material.

The second CNT device 670 may be a vertical CNT capacitor. The second CNT device 670 may comprise a CNT film 220A, a first conductive contact 250, and a second conductive contact 250. The second CNT device 670 may further comprise a dielectric layer 230 (for example as shown in FIG. 5D). The first conductive contact 250 may be formed below the CNT film 220A and in contact with the CNT film 220A. The first conductive contact 250 may be in contact with a source or drain 642 of the transistor 680A. The second conductive contact 250 may be formed on the CNT film 220A and in contact with the CNT film 220A.

According to one processing method, the first conductive contacts 250 of the first and second CNT devices 660 and 670 may be formed simultaneously. The CNT films 220A of the first and second CNT devices 660 and 670 may be formed simultaneously. The second conductive contacts 250 of the first and second CNT devices 660 and 670 may be formed simultaneously. Simultaneous processing is advantageous because it reduces the number of processing steps.

Figure 6B:
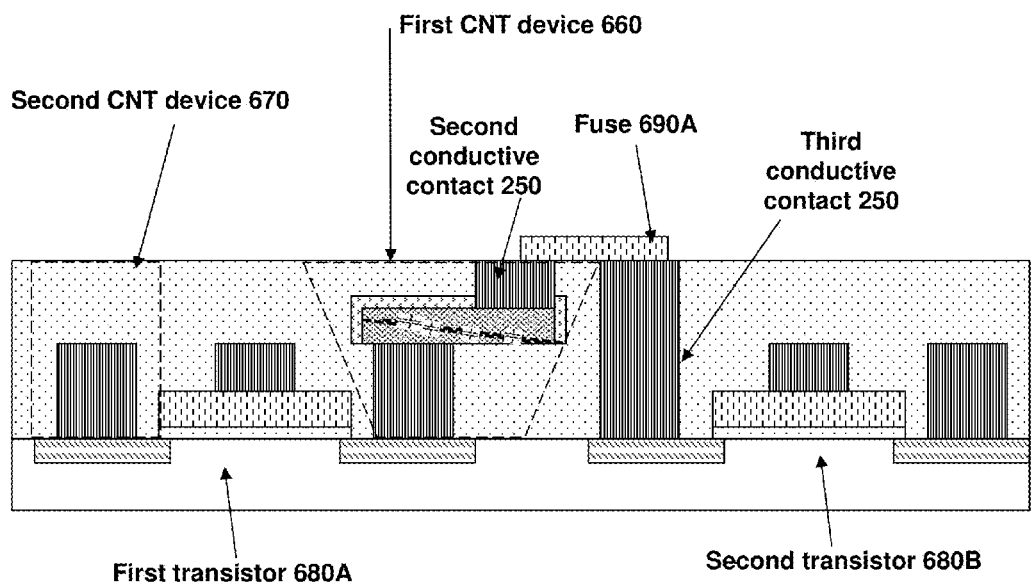

FIG. 6B is a cross-sectional view of an integrated device that includes a fuse. An integrated device 610B is similar to the integrated device 610A shown in FIG. 6A in that the integrated device 610B may include a first transistor 680A, a first CNT device 660 and a second CNT device 670. In FIG. 6B, only a portion of the second CNT device 670 is shown. The integrated device 610B may include a second transistor 680B with a fuse 690A connected to the first CNT device 660 and the second transistor 680B. The fuse 690A may be connected to the second transistor 680B using a third conductive contact 250.

The structure of the second transistor 680B may be similar to that of the first transistor 680A. The second transistor 680B may be used to switch the first CNT device 660 off (e.g., switching to a non-conductive state), and then the first CNT device 660 may operate as a capacitor (e.g., storing/discharging charge) in conjunction with the first transistor 680A not connected to the fuse 690A. The second transistor 680B may be a high voltage transistor. A fuse 690A may be made of, for example without limitation, polysilicon. The second conductive contact 250 of the first CNT device 660 may be connected to other metal layers through vias (not shown). One disadvantage of utilizing a fuse is that it would increase the cell size.

Figure 6C:
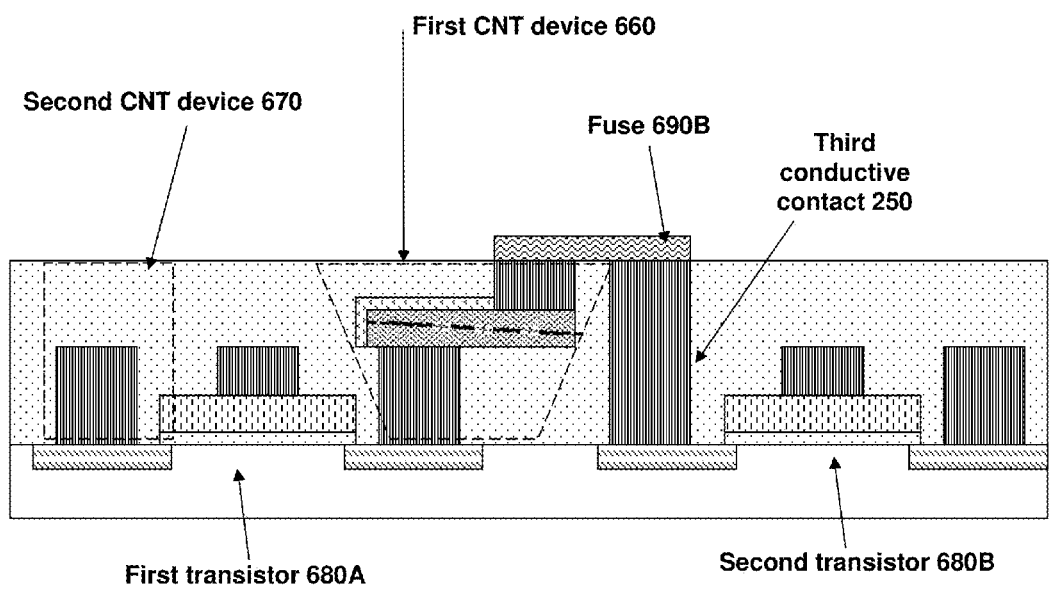

FIG. 6C is a cross-sectional view of an integrated device that includes another type of fuse. An integrated device 610C is similar to the integrated device 610B, except that a fuse 690B is a CNT film comprising CNTs. In this example, the CNT film of the fuse 690B does not contain dielectric material in its voids. The second transistor 680B may blow the fuse 690B (e.g., switch the fuse 690B to a non-conductive state) during programming. In one aspect, using a fuse is one technique for toggling the state of the capacitor, but other techniques can be implemented.

In one aspect of the disclosure, the fabrication of CNT capacitors (ultra capacitors) for on-chip applications may include the following operations: (i) forming a CNT film (e.g., a multilayered CNT fabric), (ii) forming contacts on the CNT film; (iii) switching the CNT film from an on state to an off state (i.e., no conduction between contact electrodes) with high voltages (e.g., >12 V); and (iv) forming a dielectric layer (e.g., a dielectric material having a high dielectric constant k) on the CNT film utilizing various deposition techniques.

The foregoing operations (i) through (iv) may be performed in various orders. One operational order may be (i), (ii), (iii), and then (iv). See, e.g., FIGS. 3A-3D. Another operational order may be (i), (ii), (iv) and then (iii). Yet another operational order may be (i), (iv), (ii), and then (iii). See, e.g., FIGS. 2A-2D. Yet another operational order may be (ii), (i), (iii), and then (iv). See, e.g., FIG. 4. Yet another operational order may be (ii), (i), (iv), and then (iii). These are examples, and the subject technology is not limited to these examples.

Furthermore, operation (ii) may be divided into multiple operations. For example, one or more contacts may be formed at one step (ii)-(a), and additional one or more contacts may be formed at another step (ii)-(b). Step (ii)-(a) may be forming contact(s) below the CNT film, and step (ii)-(b) may be forming contact(s) on the CNT film. Hence, one exemplary operational order may be (ii)-(a), (i), (iv), (ii)-(b), and then (iii). See, e.g., FIGS. 5A-5D. Another operational order may be (ii)-(a), (i), (ii)-(b), (iv), and then (iii). See, e.g., CNT device 660 in FIG. 6A. These are examples, and the subject technology is not limited to these examples.

In one aspect, when the CNT film is in an off state, a high voltage (e.g., >12 V) would typically be applied to turn the CNT film to an on state. The foregoing statement is for a CNT film described in this disclosure and not for a "standard" NRAM film. However, CNT capacitors having CNT film(s) that are used as on-chip capacitors typically operate at a voltage less than 3.3 V. Therefore, the CNT film(s) would not switch to an on state while the CNT capacitors operate as capacitors. When the CNT film is in an off state, there is no conduction between the electrodes on the CNT film, but the CNTs in the CNT film can hold charge, which can be used as one of the mechanisms for turning the CNT film back to an on state.

In one aspect, a method of making a CNT capacitor involves some or all of the following operations: depositing a CNT film onto a substrate; forming at least two contacts in electrically conductive contact with the CNT film; applying a voltage across the contacts sufficient to switch the CNT film to an electrically open state; and depositing a dielectric material into voids and/or pores in the CNT film.

In one aspect, one advantage of the subject CNT capacitor technology over the current capacitor (ultra-capacitor) technology is that the high surface area of the CNT film can provide high capacitance structures for on-chip applications (e.g., DRAM).

Although the CNT capacitors produced according to an aspect of the subject technology are useful for DRAM applications, their application is not limited to DRAM. For example, the CNT capacitors may be used for on-chip charge pumps that are used for generation of high voltages for electronically erasable programmable read only memories (EEPROM) or flash memory devices. The CNT capacitors can also be employed for liquid crystal display (LCD) or light emitting diode (LED) drivers. In addition, the CNT capacitors may be used for level shifters.

To create higher capacitance values, the CNT capacitors can also be fabricated into vertical or horizontal serpentines to further increase the surface area, thereby further increasing capacitance. In one aspect, CNTs may be aligned in parallel to increase capacitance.

Examples of materials that may be utilized with the subject technology are described below. In one aspect, conductive contacts (e.g., 250, 350, 352, 450, 450-1, 450-2) are conductive elements and may be a metal(s), metal alloy(s), or conductive nitride(s), oxide(s), or silicide(s). Conductive elements can be made of any conductive material, and can be the same or different material depending on the desired performance characteristics of the device.

Conductive elements can, for example, be composed of one or more of Al, Cu, W, Al (less than 1% Cu), Co, Ti, Ta, W, Ni, Mo, Pd, Pt, Ru, $CoSi_x$, $WSi_2$, TiAu, TiCu, TiPd, $TiSi_x$, TaN, TiN, TiAlN, TiW, RuN, RuO, PtSi, $Pd_2Si$, $MoSi_2$, $NiSi_x$, Ag, Au, Au/Ti, Bi, Ca, Cr, Cr/Au, Fe, In, Ir, Mg, Na, Ni, $NiSi_2$, Os, Pb, PbIn, Rh, RhSi, Sb, Sn, Pb/Sn, PbIn, Zn, $ZrSi_2$, RuN, RuO, and other suitable material.

A substrate (e.g., 210, 620, 630) may be an insulator or a semiconducting material (e.g., silicon).

A CNT may be referred to as a nanotube. CNTs can be in the form of a CNT fabric in a random or ordered array of CNTs. Methods of making CNTs, CNT fabrics and the like are known and are described in U.S. Pat. Nos. 7,566,478, 7,560,136, 7,335,395, 7,259,410, 7,115,901, 7,115,960, 6,990,009, 6,784,028, 6,835,591, 6,574,130, 6,643,165, 6,706,402, 6,919,592, 6,911,682, and 6,924,538, the contents of which are hereby incorporated by reference in their entireties. In one aspect, the CNTs used in an insulating layer may range in size from between about 10 nm to about 1 cm in length. They can be distributed into random arrays in a fabric which can have a thickness ranging from between about 5 nm to about 5 µm (e.g., 5, 10, 20, 100 nm, 5 µm and all values in between).

CNTs may be single walled, double walled, and/or multiwalled. CNTs useful in an insulating layer include singlewalled carbon nanotubes (SWNTs) that are conducting, insulating, or semi-conducting. Insulating SWNTs can be used directly. In another aspect, conducting SWNTs, semi-conducting SWNTs, and combinations thereof, can be used in the insulating layer. In such configurations, the insulating properties are obtained by application of a short voltage pulse. This process is also described is in U.S. Pat. No. 7,479,654, which is hereby incorporated by reference in its entirety. Other CNTs useful in the practice of the subject technology may include double-walled CNTs (DWNTs) and multiwalled CNTs (MWNTs).

The dielectric constant contemplated for a CNT layer can be up to about 3600. K. Ahmad et al., "Electrical Conductivity and Dielectric Properties of Multiwalled Carbon Nanotube and Alumina Composites," Applied Physics Letters, 2006, pages 33122-1 through 33122-3, Vol. 89, American Institute of Physics, describes experimental evidence of a multiwall nanotube-containing composite with a dielectric constant of 3600 in a composite with 8 vol. % purified MWNT at 1 kHz. This demonstrates the potential of a CNT or CNT film to exhibit extremely high dielectric constants. In one aspect, the dielectric constant of materials useful in the practice of the subject technology may include 3600, 3500, 3400, 3300, 3200, 3100, 3000, 2900, 2800, 2700, 2500, 2000, 1500, 1000, 900, 800, 700, 600, 500, 400, 300, 200, 100, 50, 20 and all values in between.

A dielectric layer (e.g., 230, 232, 234, 230-1, 230-2) may be sometimes referred to as a dielectric material, an insulating material or an insulating layer, and a dielectric layer may comprise one or more layers. Different dielectric layers may be made of the same or different material.

Examples of dielectric material for a dielectric layer (e.g., 230, 232, 234, 230-1, 230-2) include, but are not limited to, dielectric materials having high dielectric constant (k) such as $Al_2O_3$ (k ~9), $HfO_2$ (k ~15), $Ta_2O_5$ (k ~22), $ZrO_2$ (k ~22), $TiO_2$ (k ~85) and $Ba_xSr_{1-x}TiO_3$ (BST) (k ~200).

Below is calculated projected capacitance bounds for an on-chip CNT capacitor fabricated according to an aspect of the subject technology. To calculate the capacitance bounds both parallel plate and cylindrical capacitance equations are used: $C=e_o e_r A_s/t_{eq}$ (for parallel plate where $e_o=8.85\times 10^{-21}$ F/nm, $e_r$=insulator dielectric constant (also listed as k), $A_s$=surface area, $t_{eq}$ equivalent insulator thickness) and $C=Pi(e_o e_r)l/\cos h^{-1}(t/r)=Pi(e_o e_r)l/n[2t/r]$ with 5.26% error for t=2r (for cylindrical where l=cylinder length, t=cylinder separation, r=cylinder radius). To calculate the expected capacitance, the number of CNTs within the capacitor structures needs to be determined. For a 200 nm long, 200 nm thick, 90 nm wide CNT film, and assuming that the CNT diameter is 2 nm with a 2 nm spacing between the CNTs, there should be ~1150 CNTs within the capacitor. Assuming that half of the CNTs are connected to one electrode and the other half are connected to the second electrode gives ~575 CNTs per conductor. For the parallel plate capacitance, the surface area of the CNTs can be calculated with $A_s=[2(pi)r^2+2(pi)rl]\times$# of CNTs=$7.26\times 10^5$ nm$^2$. Therefore, if $HfO_2$ is used as the dielectric material ($e_r$=15) and the spacing of the CNTs is 2 nm ($t_{eq}$ 2 nm), then the parallel plate capacitance would be ~70.8 fF, which is much higher than the 20 fF required for DRAM. Even if the available number of CNTs for the capacitance is only one fourth the total number of CNTs (287 CNTs), the capacitance would still be ~35.4 fF. For a similarly dimensioned metal parallel plate capacitor with a 2 nm spacing between the electrodes, the capacitance would be calculated as 1.2 fF (=$8.85\times 10^{-21}\times 15\times 90\times 200/2$). This is much smaller than the capacitance required for DRAM, which is the driving force for the deep trench or 3-D capacitor designs that are currently required with conventional capacitor technology.

To put a potential lower limit on the CNT capacitance, the cylindrical capacitance can also be calculated to give ~0.06 fF per CNT. Therefore, for 575 CNTs in parallel, the capacitance would be ~34.6 fF, which is above the requirements for DRAM, or 17.3 fF if only one fourth of the CNTs contribute to the capacitance, which is slightly lower than that required for DRAM, but easily managed with either slight changes in dimension, density of CNTs, or other factors.

Because of the much higher capacitance values associated with the CNT capacitors or ultra-capacitors produced according to an aspect of the subject technology, lower dielectric constant materials for the creation of on-chip capacitors may be utilized. As an example, using the parallel plate equations and silicon nitride as the insulating material (k=7.5), the capacitance would be ~24.1 fF. The CNT capacitor methodology according to an aspect of the subject technology has an advantage over other CNT capacitor technology in that the CNTs are not purely acting as a high surface area conducting plate—i.e., CNT electrode-high dielectric constant insulator-CNT electrode. Although the surface area is increased compared to the metal plate, the curvature of packed CNTs is not expected to be immensely higher than the roughness of a deposited conducting film. As mentioned above, DRAM manufacturers utilize complex processing to create high surface area rough conducting plates. Furthermore, the CNTs within the CNT electrode that are located away from the insulator interface would have only a minimal impact on the overall capacitance.

Since one exemplary application of an aspect of the subject technology is to use nanoscale materials to build high capacitance devices, the subject technology may include provisions to improve alignment of the CNTs within the CNT film. The reason for this involves capacitance enhancement through parallel capacitors. Basic capacitance principles govern that capacitance adds when devices are parallel to one another (i.e., $C_{TOTAL}=C_1+C_2+\ldots+C_N$ where N is the number of capacitors connected in parallel). On the other hand, series capacitors add in inverse ($1/C_{TOTAL}=1/C_1+1/C_2+\ldots+1/C_N$). These basic relations emphasize the fact that alignment in the direction of initial current flow (horizontally for the horizontal embodiments; vertically for vertical embodiments) is important for enhanced capacitance. If the alignment is a constraint, in one aspect, the method of contact must also be constrained in order to provide reasonable contact to all aligned CNTs and CNT paths to enable capacitance enhancement. Improper alignment could result in the opposite effect, where effective capacitance is reduced due to series capacitor formation within the CNT film. Additionally, alignment of the CNTs within the structure may increase the packing density of the CNTs, which in turn should may increase the surface area of the CNT capacitor structure. Alignment of multilayered CNT films can be obtained by using the surface adhesion/wetting (or lack of) of an aqueous-based CNT solution by employing a patterned surface functionalizing agent such as hexamethyldisilazane (HMDS), which during coating with the CNT solution will cause the CNTs to repel into a confined area so as to provide further alignment of the CNTs.

In another exemplary embodiment of the subject technology, the CNT film may be functionalized with electron acceptors including, but not limited to, TCNQ (Tetracyanoquinodimethane), $F_4$TCNQ (2,3,5,6-Tetrafluoro-7,7,8,8-tetracyanoquinodimethane), and DDQ (2,3-Dichloro-5,6-dicyano-p-benzoquinone) to further increase the charge storage, thereby increasing capacitance of the multilayered fabric. Electron accepting molecules (such as those described above) can also be deposited within the CNT film before or after toggling the device to an off state. For example, electron acceptors may be incorporated into the CNT film before the CNT film is deposited on a substrate (e.g., before FIG. 2A) or after the CNT film is deposited on the substrate (e.g., after FIG. 2A). In another exemplary configuration of the subject technology, conductive (e.g., metallic) or semiconducting nanoparticles may be deposited within the CNT film to increase the capacitance of the multilayered CNT film.

Figure 7A:
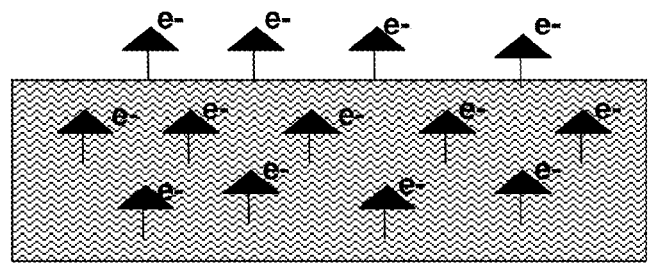
FIG. 7A illustrates an example of a representation of functionalization of nanoparticles adhered to CNTs.
Figure 7B:
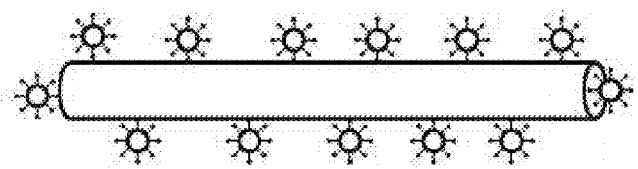
FIG. 7B illustrates an example of a single functionalized CNT.
Figure 7C:
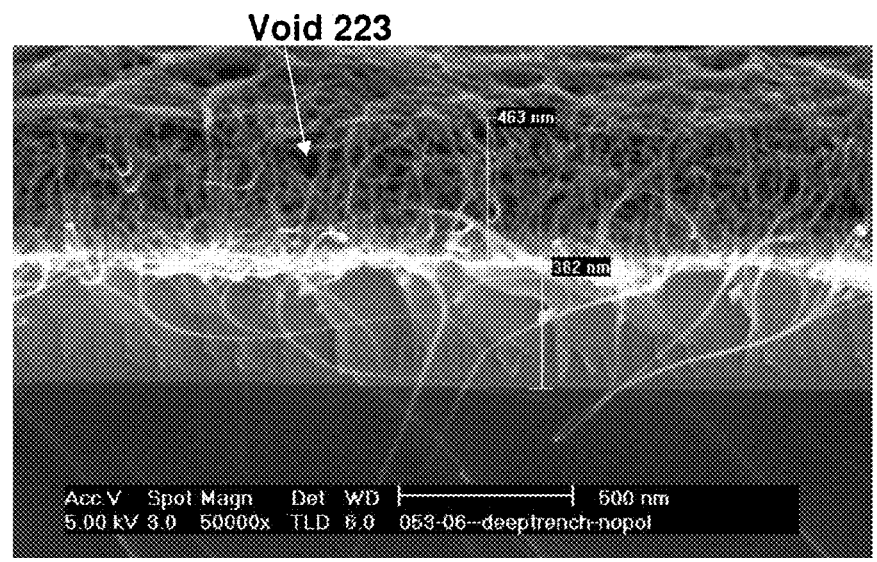
FIG. 7C is an example of an image of a CNT film.

FIG. 7A illustrates a representation of functionalization of nanoparticles adhered to CNTs. FIG. 7B illustrates a single functionalized CNT. FIG. 7C is an example of an image of a CNT film. The image shows voids 223, which are spaces between the CNTs in the fabric. While only one arrow is shown in FIG. 7C, voids are all throughout the fabric. In this image, a dielectric layer (e.g., 230) is not shown.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects.

In one aspect, the elements shown in various figures are directly attached to one another as shown in the figures. In another aspect, the elements shown in various figures may be attached to one another indirectly. In one aspect, various elements are co-planar with each other as shown in the figures. When a first element is described as being disposed on a second element, in one aspect, the first element may be disposed above the second element, in another aspect, the first element may be disposed under the second element, and in yet another aspect, the first element may be disposed on a side of the second element.

The claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

Terms such as "top," "bottom," "upper," "lower," "side" and the like as used in this disclosure should be understood as referring to an arbitrary frame of reference, rather than to the ordinary gravitational frame of reference. Thus, a top surface, a bottom surface, an upper surface, a lower surface, and a side surface may extend upwardly, downwardly, diagonally, or horizontally in a gravitational frame of reference.

In one aspect, a transistor may refer to a field effect transistor, a bipolar transistor or any other type of transistors. In another aspect, a transistor may refer to a diode or another type of semiconductor device.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A carbon nanotube capacitor, comprising:
   a carbon nanotube film comprising carbon nanotubes and voids having a dielectric material;
   a first electrical conductive contact disposed on the carbon nanotube film; and
   a second electrical conductive contact disposed on the carbon nanotube film,
   wherein the carbon nanotube film is configured to switch from a conductive state to a non-conductive state when a voltage is applied by creating an electrical break within the carbon nanotube film and providing a first conductive region and a second conductive region within the carbon nanotube film,
   wherein the electrical break separates the first conductive region from the second conductive region within the carbon nanotube film,
   wherein the first conductive region within the carbon nanotube film is configured to store charge, and the second conductive region within the carbon nanotube film is configured to store charge.

2. The carbon nanotube capacitor of claim 1, further comprising:
   a dielectric layer disposed on the carbon nanotube film,
   wherein the dielectric layer comprises the dielectric material.

3. The carbon nanotube capacitor of claim 2,
   wherein the first electrical conductive contact is separated horizontally from the second electrical conductive contact by a distance,
   wherein the first electrical conductive contact and the second electrical conductive contact are disposed on a top surface of the carbon nanotube film,
   wherein the first electrical conductive contact is disposed at a first end of the carbon nanotube film,
   wherein the second electrical conductive contact is disposed at a second end of the carbon nanotube film,
   wherein at least some of the dielectric layer is disposed between the first electrical conductive contact and the second electrical conductive contact, wherein the at least some of the dielectric layer is disposed on the top surface of the carbon nanotube film,
wherein the material of the dielectric layer is the same as the material of the dielectric material in the voids of the carbon nanotube film.

4. The carbon nanotube capacitor of claim 2,
wherein the carbon nanotube film comprises a first region and a second region,
wherein the first region comprises carbon nanotubes and the voids having the dielectric material,
wherein the second region comprises carbon nanotubes and voids without the dielectric material,
wherein the first region is located directly under the dielectric layer and directly under a first portion of the first electrical conductive contact and a first portion of the second electrical conductive contact,
wherein the second region is not in direct contact with the dielectric layer,
wherein the second region is located directly under a second portion of the first conductive electrical contact and a second portion of the second electrical conductive contact,
wherein the second region is conductive.

5. The carbon nanotube capacitor of claim 2, further comprising:
a second carbon nanotube film comprising carbon nanotubes and voids having dielectric material, the second carbon nanotube film disposed on the dielectric layer;
a third electrical conductive contact disposed on the second carbon nanotube film;
a fourth electrical conductive contact disposed on the second carbon nanotube film;
a second dielectric layer disposed on the second carbon nanotube film,
wherein the first and second electrical conductive contacts are disposed below the carbon nanotube film,
wherein the carbon nanotube film is disposed below the dielectric layer,
wherein the third and fourth electrical conductive contacts are disposed below the second carbon nanotube film,
wherein the dielectric layer is disposed below the second carbon nanotube film,
wherein the second carbon nanotube film is disposed below the second dielectric layer,
wherein the third and fourth electrical conductive contacts and the dielectric layer are co-planar,
wherein the thickness of the third electrical conductive contact, the thickness of the fourth electrical conductive contact, and the thickness of the dielectric layer are the same,
wherein the first electrical conductive contact is separated horizontally from the second electrical conductive contact by a distance,
wherein the third electrical conductive contact is separated horizontally from the fourth electrical conductive contact by the distance.

6. The carbon nanotube capacitor of claim 2,
wherein the first electrical conductive contact is disposed below the carbon nanotube film,
wherein the second electrical conductive contact is disposed above the carbon nanotube film.

7. The carbon nanotube capacitor of claim 2,
wherein the first electrical conductive contact is separated horizontally from the second electrical conductive contact by a distance,
wherein the first electrical conductive contact is disposed on a bottom surface of the carbon nanotube film, and the second electrical conductive contact is disposed on a top surface of the carbon nanotube film,
wherein the first electrical conductive contact is disposed at a first end of the carbon nanotube film,
wherein the second electrical conductive contact is disposed at a second end of the carbon nanotube film,
wherein at least some of the dielectric layer is disposed on the top surface of the carbon nanotube film,
wherein at least some of the dielectric layer is disposed on side surfaces of the carbon nanotube film,
wherein the material of the dielectric layer is the same as the material of the dielectric material in the voids of the carbon nanotube film.

8. The carbon nanotube capacitor of claim 3,
wherein the dielectric layer, the first electrical conductive contact and the second electrical conductive contact together completely cover the top surface of the carbon nanotube film,
wherein the dielectric layer completely covers the side surfaces of the carbon nanotube film,
wherein the first and second electrical conductive contacts are connected to the carbon nanotube film through vias in the dielectric layer.

9. The carbon nanotube capacitor of claim 3,
wherein the dielectric layer, the first electrical conductive contact and the second electrical conductive contact together completely cover the top surface of the carbon nanotube film,
wherein the first electrical conductive contact and the second electrical conductive contact are disposed on side surfaces of the carbon nanotube film and completely cover the side surfaces of the carbon nanotube film.

10. The carbon nanotube capacitor of claim 9,
wherein the dielectric layer is disposed over the first electrical conductive contact and the second electrical conductive contact.

11. The carbon nanotube capacitor of claim 5,
wherein the carbon nanotube film comprises a first region and a second region,
wherein the first region comprises carbon nanotubes and the voids having the dielectric material,
wherein the second region comprises carbon nanotubes and voids without the dielectric material,
wherein the first region is in contact with the dielectric layer, in contact with a first portion of the first electrical conductive contact, and in contact with a first portion of the second electrical conductive contact,
wherein the second region is not in direct contact with the dielectric layer,
wherein the second region is in contact with a second portion of the first electrical conductive contact and in contact with a second portion of the second electrical conductive contact,
wherein the second region is conductive.

12. The carbon nanotube capacitor of claim 6,
wherein the second electrical conductive contact is connected to the carbon nanotube film through a via in the dielectric layer,
wherein at least a portion of the dielectric layer and the second electrical conductive contact are co-planar.

13. The carbon nanotube capacitor of claim 6,
wherein the width of the carbon nanotube film, the first electrical conductive contact and the second electrical conductive contact are substantially the same.

14. The carbon nanotube capacitor of claim 6,
wherein the first and second electrical conductive contacts are separated vertically by a distance,
wherein the first electrical conductive contact and the second electrical conductive contact overlap in a horizontal direction.

15. An integrated device, comprising:
a substrate;
a first transistor on the substrate, the first transistor comprising multiple terminals;
a carbon nanotube capacitor on the substrate, the carbon nanotube capacitor comprising:
   a carbon nanotube film comprising carbon nanotubes and voids having a dielectric material;
   a first electrical conductive contact disposed on the carbon nanotube film;
   a second electrical conductive contact disposed on the carbon nanotube film; and
   a dielectric layer disposed on the carbon nanotube film,
wherein the first electrical conductive contact is connected to one of the multiple terminals,
wherein the carbon nanotube capacitor is either a horizontal carbon nanotube capacitor or a vertical carbon nanotube capacitor;
a second transistor on the substrate; and
a fuse,
wherein the fuse is coupled between the carbon nanotube capacitor and the second transistor.

16. The integrated device of claim 15, wherein the fuse comprises carbon nanotubes.

17. The integrated device of claim 15, wherein the fuse comprises polysilicon.

18. A method of manufacturing a carbon nanotube device, comprising:
providing a carbon nanotube film comprising carbon nanotubes and voids;
forming a first electrical conductive contact on the carbon nanotube film;
forming a second electrical conductive contact on the carbon nanotube film;
forming a dielectric layer on the carbon nanotube film, comprising:
   providing a dielectric material from the dielectric layer into voids in the carbon nanotube film; and
applying a voltage across the first electrical conductive contact and the second electrical conductive contact sufficient to switch the carbon nanotube film from a conductive state to a non-conductive state,
wherein the applying of the voltage creates an electrical break within the carbon nanotube film and produces a first conductive region and a second conductive region within the carbon nanotube film,
wherein the first conductive region and the second conductive region are charge storage regions.

19. The method of claim 18,
wherein the forming of the first electrical conductive contact and the forming of the second electrical conductive contact are performed after the carbon nanotube film is provided,
wherein the applying of the voltage is performed after the forming of the first electrical conductive contact and the forming of the second electrical conductive contact,
wherein the forming of the dielectric layer is performed after the voltage is applied.

20. The method of claim 18,
wherein the forming of the dielectric layer is performed before the voltage is applied,
wherein the applying of the voltage is performed after the forming of the first electrical conductive contact and the forming of the second electrical conductive contact.

21. The method of claim 18,
wherein the applying of the voltage across the first electrical conductive contact and the second electrical conductive contact switches the carbon nanotube film from the conductive state between the first and second electrical conductive contacts to the non-conductive state between the first and second electrical conductive contacts,
wherein the voltage is higher than any voltage applied to the carbon nanotube device while the carbon nanotube device operates as a capacitor for storing or discharging the carbon nanotube device so that the voltage does not switch the carbon nanotube film from the non-conductive state to the conductive state while the carbon nanotube device operates as the capacitor.

22. A method of manufacturing a carbon nanotube device, comprising:
providing a carbon nanotube film comprising carbon nanotubes and voids;
forming a first electrical conductive contact on the carbon nanotube film;
forming a second electrical conductive contact on the carbon nanotube film;
forming a dielectric layer on the carbon nanotube film, comprising:
   providing a dielectric material from the dielectric layer into voids in the carbon nanotube film; and
applying a voltage across the first electrical conductive contact and the second electrical conductive contact sufficient to switch the carbon nanotube film from a conductive state to a non-conductive state,
wherein the forming of the first electrical conductive contact and the forming of the second electrical conductive contact are performed after the carbon nanotube film is provided,
wherein the applying of the voltage is performed after the forming of the first electrical conductive contact and the forming of the second electrical conductive contact,
wherein the forming of the dielectric layer is performed after the voltage is applied.

* * * * *